United States Patent
Suzuki et al.

[11] Patent Number: 6,163,146
[45] Date of Patent: *Dec. 19, 2000

[54] IC TESTING METHOD

[75] Inventors: Katuhiko Suzuki, Gunma; Takeshi Onishi, Gyoda; Hidetaka Nakazawa, Gunma, all of Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/042,802

[22] Filed: Mar. 17, 1998

[30] Foreign Application Priority Data

Mar. 18, 1997 [JP] Japan .................................. 9-064350

[51] Int. Cl.$^7$ .................................................. G01R 31/02
[52] U.S. Cl. ......................................................... 324/158.1
[58] Field of Search ................................. 324/158.1, 754, 324/765, 758, 73.1

[56] References Cited

U.S. PATENT DOCUMENTS

| | | | |
|---|---|---|---|
| 5,150,797 | 9/1992 | Shibata | 414/404 |
| 5,290,134 | 3/1994 | Baba . | |
| 5,788,084 | 8/1998 | Onishi et al. | 324/158.1 |
| 5,801,527 | 9/1998 | Ishii et al. | 324/158.1 |

FOREIGN PATENT DOCUMENTS

| | | |
|---|---|---|
| 6-027193 | 4/1994 | Japan . |
| 8-262102 B1 | 10/1996 | Japan . |

*Primary Examiner*—Vinh P. Nguyen
*Assistant Examiner*—Minh Tang
*Attorney, Agent, or Firm*—Staas & Halsey LLP

[57] ABSTRACT

An IC testing method is disclosed in which IC's to be tested are placed on IC carriers disposed in an m-row, n-column array on a test tray in a loader, and the IC's to be tested are connected to sockets disposed as an m-row, k-column array on a socket attachment in a manner corresponding to every a-th column of the IC carriers in a testing section for purpose of measurement. n and k are integers equal to or greater than two, n=ak where a is an integer equal to or greater than two. The IC testing method comprises the steps of determining if the number of IC's to be tested which are present in the loader is greater than the number of IC carriers, if it is determined that the number of IC's to be tested is equal to or greater than the number of IC carriers, causing the loader to load the IC's to be tested on all the IC carriers on the test tray, and causing the test section to connect the loaded IC's to be tested which are located in k columns corresponding to every a-th column of the IC carriers with the corresponding sockets to perform a test of simultaneous measurement and to repeat the test a times while translating the test tray by an IC carrier array pitch, thus completing the testing of all the IC's to be tested on the test tray. If it is determined that the number of IC's to be tested is less than the number of IC carriers, the IC's to be tested are disposed at respective positions in a sequence of columns which are subject to a simultaneous measurement in the test section, and the IC's to be tested in every a-th column of the IC carriers are connected with the corresponding sockets to perform a test of simultaneous measurement in the test section, and such test is repeated while translating the test tray by an IC carrier array pitch.

6 Claims, 6 Drawing Sheets

FIG.6A
| COLUMN NO. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| | ● | ● | | | ● | ● | | | ● | ● | | | ● | ● | | |
| | ● | ● | | | ● | ● | | | ● | ● | | | ● | ● | | |
| | ● | ● | | | ● | ● | | | ● | ● | | | ● | ● | | |
| | ● | ● | | | ● | ● | | | ● | ● | | | ● | ● | | |
| TEST ORDER | 1 | 2 | 1 | 2 | 1 | 2 | 1 | 2 | 1 | 2 | 1 | 2 | 1 | 2 | 1 | 2 |
| TEST ORDER | 1 | 2 | 3 | 4 | 1 | 2 | 3 | 4 | 1 | 2 | 3 | 4 | 1 | 2 | 3 | 4 |
24
14
FIG.6B
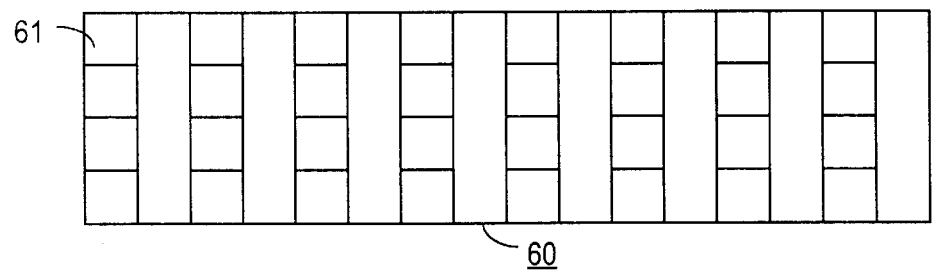
FIG.6C
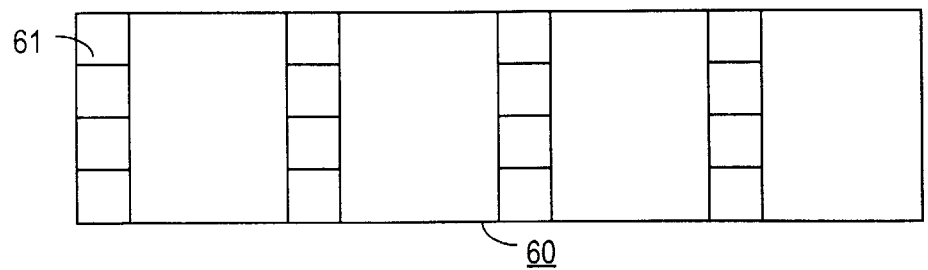

IC TESTING METHOD

BACKGROUND OF THE INVENTION

1. Field of the Invention

The invention relates to a semiconductor testing method, and in particular, to a method in which an IC is loaded from an IC loader to a test tray for executing a test efficiently.

2. Description of the Related Art

An IC testing equipment of the type is already implemented for practical use which conveys a semiconductor IC, hereafter simply referred to as IC, as mounted on a test tray, conducts an electrical test of the IC in a test section as it is placed on the test tray, delivers the tested IC together with the test tray out of the test section, and classifies the tested IC in accordance with a result of the test. An IC testing equipment, commonly referred to as an IC tester, which applies a test signal of a given pattern to an IC to determine the electrical response is often connected to an IC conveyor and processing apparatus, generally referred to as a handler, which conveys the IC to be tested to a test section where the IC to be tested is brought into electrical contact with a socket of the test head of the testing equipment, which represents a measuring unit of the equipment to supply and receive a variety of test signals, conveys the tested IC out of the test section subsequent to the completion of the test, and classifies the tested IC's into either acceptable and rejected products in accordance with data representing results of the test. An IC testing equipment as termed herein refers to one which is integrally provided with a handler of the kind described above.

An example of a conventional handler which is referred to as a horizontal conveyance type will be described with reference to FIG. 1. A handler 10 shown comprises a loader 11 by which an IC to be tested which is placed on a customer tray or a user tray 13 by a user is transferred to and repositioned on a test tray 14 capable of withstanding elevated and/or lower temperatures, a thermostatic chamber 20 including a test section 21 which tests an IC to be tested which is conveyed from the loader 11, and an unloader 12 which transfers a tested IC 15, as it is conveyed on the test tray 14 subsequent to the completion of the test in the test section 21, back to the customer tray 13 from the test tray 14. (The placement of the tested IC generally takes place, most frequently, onto a corresponding customer tray as classified in accordance with test result data.)

Test tray 14 is put on a circulating path starting from the loader 11, passing through the thermostatic chamber 20 and the unloader 12 and back to the loader 11. The test tray 14 on which the IC to be tested 15 is placed is conveyed from the loader 11 into a soak chamber 22 inside the thermostatic chamber 20, where it is heated or cooled to a given constant temperature while being kept placed on the test tray 14. The soak chamber 22 is generally constructed so that a plurality of test trays 14, which may be ten in number, for example, can be contained therein in a vertical stack, in a manner such that a test tray which comes anew from the loader 11 is positioned uppermost in the stack while the lowermost test tray in the stack is conveyed into the test section 21 in the thermostatic chamber 20. An intended thermal stress to a given elevated or lower temperature is applied to the IC to be tested 15 by heating or cooling it while it moves through sequential positions from the top to the bottom of the stack within the soak chamber 22.

The IC to be tested 15 which is thus heated or cooled to the given temperature is conveyed on its test tray 14 from the soak chamber 22 to the test section 21 while maintaining its temperature, and is then brought into electrical contact with an IC socket, not shown, disposed within the test section 21 while it remains mounted on the test tray 14 in order to determine its electrical response. Upon completion of the test, the tested IC 15 as mounted on the test tray 14 is conveyed into an exit chamber 23 from the test section 21 and is then allowed to be returned to an ambient temperature.

The exit chamber 23 is constructed to contain test trays in a vertical stack in the similar manner as in the soak chamber 22, such that the tested IC 15 is returned to the ambient temperature while it moves through sequential position in the stack from the bottom to the top. After being returned to the ambient temperature, the tested IC 15 as mounted on the test tray 14 is conveyed into the unloader 12 where it is categorized in accordance with a test result and transferred from the test tray 14 to be placed onto a corresponding customer tray 13. Test tray 14 which is emptied in the unloader 12 is conveyed to the loader 11, where another IC to be tested 15 is again transferred from its customer tray 13 onto the emptied test tray 14. A similar operation as described is then repeated.

Conveying the IC to be tested 15 and the tested IC between the customer tray 13 and the test tray 14 is normally accomplished by using an air cluck which utilizes a vacuum pump, and which allows a number of IC's to be tested 15, for example, up to eight IC's, to be held attracted at one time for transfer. In each of the loader 11 and the unloader 12, a transfer arm 30 carries the customer tray 13 between a position where the IC to be tested 15 is transferred onto the test tray 14 and a position where it receives the tested IC from the test tray 14.

In this manner, the IC to be tested 15 is placed onto the test tray in the loader 11 and conveyed into the test section 21, and upon completion of the test, it is conveyed, as mounted on the test tray, from the test section 21 to the unloader 12. In the test section 21, the IC to be tested 15 as placed on the test tray is electrically connected with an IC socket which is supplied with a given test pattern signal from an IC testing equipment, hereafter referred to as an IC tester, for conducting an electrical response test. The test section 21 of the handler is disposed within the thermostatic chamber 20 for the need of testing the IC to be tested 15 at a given temperature environment, and it is also required that the IC socket of the IC tester which is mounted on the test head be disposed in heat isolation within the thermostatic chamber 20.

FIG. 2 shows an exemplary construction of the test tray 14. It comprises a rectangular frame 16 across which a plurality of crosspieces 17, spaced apart at an equal interval, extend parallel to the lengthwise direction of the frame 16. A plurality of mounts 18 are formed along each side of crosspiece as well as along long sides 16a, 16b of the frame 16 which oppose the crosspieces 17 at an equal interval so as to project from the crosspieces and the long sides. The mounts 18 on the opposite sides of each crosspiece are disposed in a staggered manner so that a mount 18 on one side is located intermediate a pair of mounts 18 on the other side. Similarly, mounts 18 on the long sides 16a, 16b of the frame 16 are disposed so that each of them is located intermediate a pair of mounts 18 on the opposing crosspiece 17. A multiplicity of IC carriers 24, which are commonly termed in the art as "tray inserts", are disposed in juxtaposition with each other in the spaces defined between opposing crosspieces 17 and between the crosspieces 17 and their opposing long sides 16a, 16b.

Each IC carrier 24 is received in a carrier stowage 19, which is a rectangular area containing a pair of staggeredly opposing mounts 18 at its diagonal corners. In the example shown, sixteen mounts 18 are formed along each side of the crosspiece 17, thus defining sixteen carrier stowages 19 in each space to allow sixteen IC carriers to be mounted therein. Since there are four such spaces in the example, a total of 16×4 or 64 IC carriers 24 can be mounted on a single test tray 14. Each IC carrier 24 is mounted across a pair of mounts 18 by fasteners 28, for example.

All of IC carriers 24 are of an identical profile and an identical size, and have an IC receiver 25 formed at the center in which an IC to be tested is contained. In the present example, the IC receiver is in the form of a square recess. It will be appreciated that the profile and the size of the IC receiver 25 are determined in conformity to the profile and the size of an IC element to be contained therein. Accordingly, for each IC element having a different profile and size, there is provided an IC carrier 24 having an IC receiver 25 of a corresponding profile and size, thus changing IC carriers in accordance with the profile and size of the IC to be tested.

The IC carrier 24 has a profile which is chosen to provide a loose fit thereof in the space defined by opposing mounts of the carrier stowage 19, and is provided at its opposite ends with projections which are disposed on the mounts 18. Each projection is laterally formed with an opening 26 which receives the fastener 28 and is centrally formed with an opening 27, into which a positioning pin is inserted.

IC's to be tested 15 are mounted in individual IC carriers 24 of the test tray 14 shown in FIG. 2, and are then conveyed from the loader 11 into the test section 21 within the thermostatic chamber 20. While they are placed on the test tray 14, they are brought into electrical contact with IC sockets arrayed on a socket attachment which is mounted on the test head for conducting an electrical response test.

An example of socket attachment 60 adapted to be mounted on the test head and which may be used with the test tray 14 constructed in the manner shown in FIG. 2 is shown in FIG. 3. In this example, the socket attachment 60 includes an array of IC sockets 61 in a four-row, eight-column matrix form. The number of rows in the array of IC sockets 61 is equal to the number of rows of IC carriers 24 mounted on the test tray 14 while the column of the socket array corresponds to every other column in the array of IC carriers 24 on the test tray 14. Thus the number of columns in the socket array is one-half the number of columns of IC carriers 24. This is because of a limitation on the number of IC's which can be tested at one time by a single IC tester, which cannot test as many as sixty-four IC's in one step.

Accordingly, when conducting a test using the test tray 14 having the 4×16 array of IC carriers 24 as shown in FIG. 2 and the socket attachment 60 having the 4×8 array of IC sockets 61 as shown in FIG. 3, the procedure initially connects thirty-two IC's in eight odd-numbered columns 1, 3, . . . , 15 with IC sockets 61 in eight columns to conduct a test, and then translates the test tray 14 by a carrier array pitch to connect remaining thirty-two IC's in eight even-numbered columns 2, 4, . . . , 16 with IC sockets 61 in eight columns to conduct a test, as shown in side elevation in FIG. 4.

In the prior art practice of loading IC's to be tested from the loader onto the test tray 14, a reduction in the loading time is achieved by sequentially loading eight IC's at one time from the customer tray onto the first and the second half of each row of IC carriers 24 in 4×16 array on the test tray 14, thus completing the loading on all the carriers of the test tray 14 with IC's through eight loading operations. When the number of IC's to be tested which are to be loaded on the test tray 14 is less than the maximum loadable number of sixty-four, for example, equal to thirty-two, these thirty-two IC's are packed into the first and the second row, as shown in FIG. 5 where a solid or black circle and a white circle indicate the presence and the absence of IC's.

For purpose of illustration, suppose that one lot of IC's to be tested is equal to 608 IC's. Then it will be seen that the test for the lot of 608 IC's will be completed when a loading and a testing of sixty-four IC's on a test tray having the maximum loadable number of sixty-four are repeated for 9 test trays and when finally remaining thirty-two IC's are loaded on a single test tray and tested.

FIG. 5 illustrates that IC's are loaded from the left end of the first row to the right end of the second row in immediately adjacent relationship and without any vacancy, on the presumption that sixteen IC's are loaded in one row of the test tray having the maximum loadable number of sixty-four. However, the IC tester cannot test all of sixty-four IC's simultaneously for the reason mentioned previously when the test is conducted by conveying the loaded test tray into the test section. For a test tray having the maximum loadable number of sixty-four, the measurement of all IC's will be completed in a number of tests, which is equal to two at minimum.

Considering the test applied to the remaining thirty-two IC's of the lot, a loading of eight IC's onto the test tray will be repeated four times, and IC's are packed in the direction of the row on the test tray. The measurement is applied to an IC in every other IC carrier. It will then be seen that the measurement for this IC array must be conducted in a number of tests which is equal to two at minimum in the similar manner as when all the carriers of the tray are fully loaded with IC's. Thus IC's in every other IC carrier, which may be odd-numbered columns 1, 3, 5, 7, . . . , 31, are subject to a simultaneous measurement, and then remaining IC's in every other IC carrier, which may be even-numbered columns 2, 4, 6, 8, . . . , 32, are subject to a simultaneous measurement. Thus a total of two measurements must be conducted.

SUMMARY OF THE INVENTION

It is an object of the invention to provide an IC testing method which minimizes the number of tests.

In accordance with the invention, there is provided an IC testing method in which a loader loads IC's to be tested on IC carriers disposed in an m-row, n-column array on a test tray and in which a test section connects IC's to be tested with sockets disposed in an m-row, k-column array on a socket attachment to conduct a measurement, the column on the socket attachment corresponding to every a-th column of IC carriers, where both m and k are integers equal to or greater than two, n=ak where a is an integer equal to or greater than two, comprising the steps of (a) determining if the number of IC's to be tested in the loader is greater than the number of IC carrier;

(b) if the number of IC's to be tested is equal to or greater than the number of IC carriers, causing the loader to load IC's to be tested on all of the IC carriers in the test tray, causing the test section to connect the IC's to be tested in the k columns which correspond to every a-th column of the IC carriers with the corresponding sockets to perform a test of simultaneous measurement, and repeating the test a times while translating the test tray by an IC carrier array pitch, thus completing a test for all the IC's to be tested on the test tray; and (c) if it is determined at step (a) that the number of IC's to be tested is less than the number of IC carriers, disposing the IC's to be tested at respective positions in a sequence of columns which are subject to a simultaneous measurement in the test section, causing the test section to connect the IC's to be tested which are located in a manner corresponding to every a-th column of IC carriers with the corresponding sockets to perform a test of simultaneous measurement, and repeating the test while translating the test tray by an IC carrier array pitch, thus completing a test for all the IC's to be tested on the test tray.

BRIEF DESCRIPTION OF THE DRAWINGS

FIG. 6A is an illustration of a loading of IC's on a test tray according to the present invention;

FIG. 6B is a plan view of a socket attachment having a 4×8 array of sockets;

FIG. 6C is a plan view of a socket attachment having a 4×4 array of sockets.

DETAILED DESCRIPTION OF PREFERRED EMBODIMENT

Generally, when an m×n array is used for IC carriers on a test array, sockets on a socket attachment will be disposed in an m×k array having the same number of rows where n=a×k and a is an integer equal to or greater than 2. FIG. 6A shows a test tray having an m×n array of IC carriers where m=4 and n=16. FIG. 6B shows a socket array for a socket attachment where a=2 or k=8, and FIG. 6C shows a socket array on a socket attachment where a=4 or k=4. When a=2 and k=8 (FIG. 6B), the IC sockets will be disposed in a manner corresponding to every other column of carriers shown in FIG. 6A. When a=4 and k=4 (FIG. 6C), the IC sockets are disposed in a manner corresponding to every fourth column of carriers.

Figure 1:
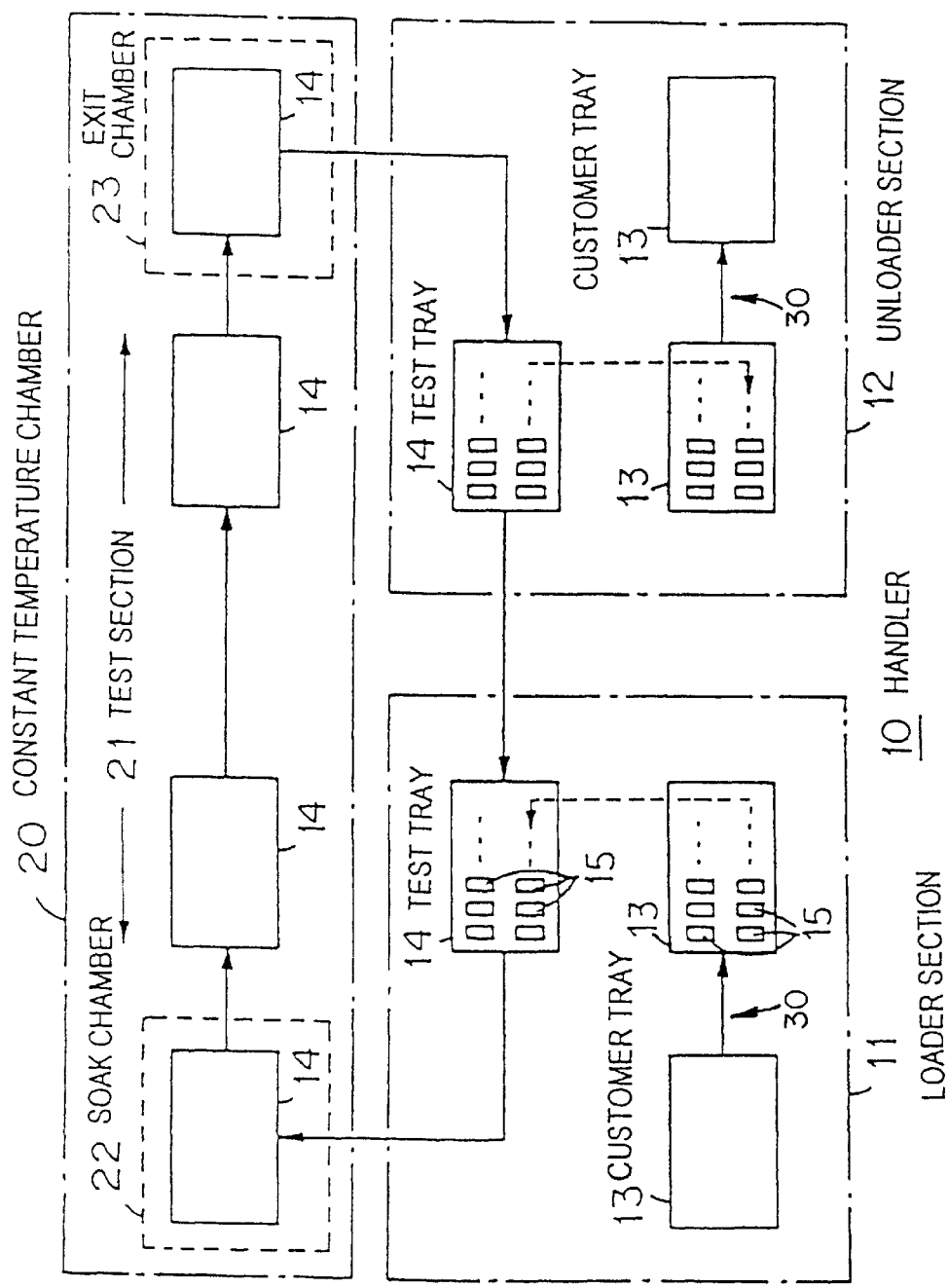
FIG. 1 is a plan view schematically illustrating the arrangement of a conventional IC tester to which the invention may be applied.
Figure 2:
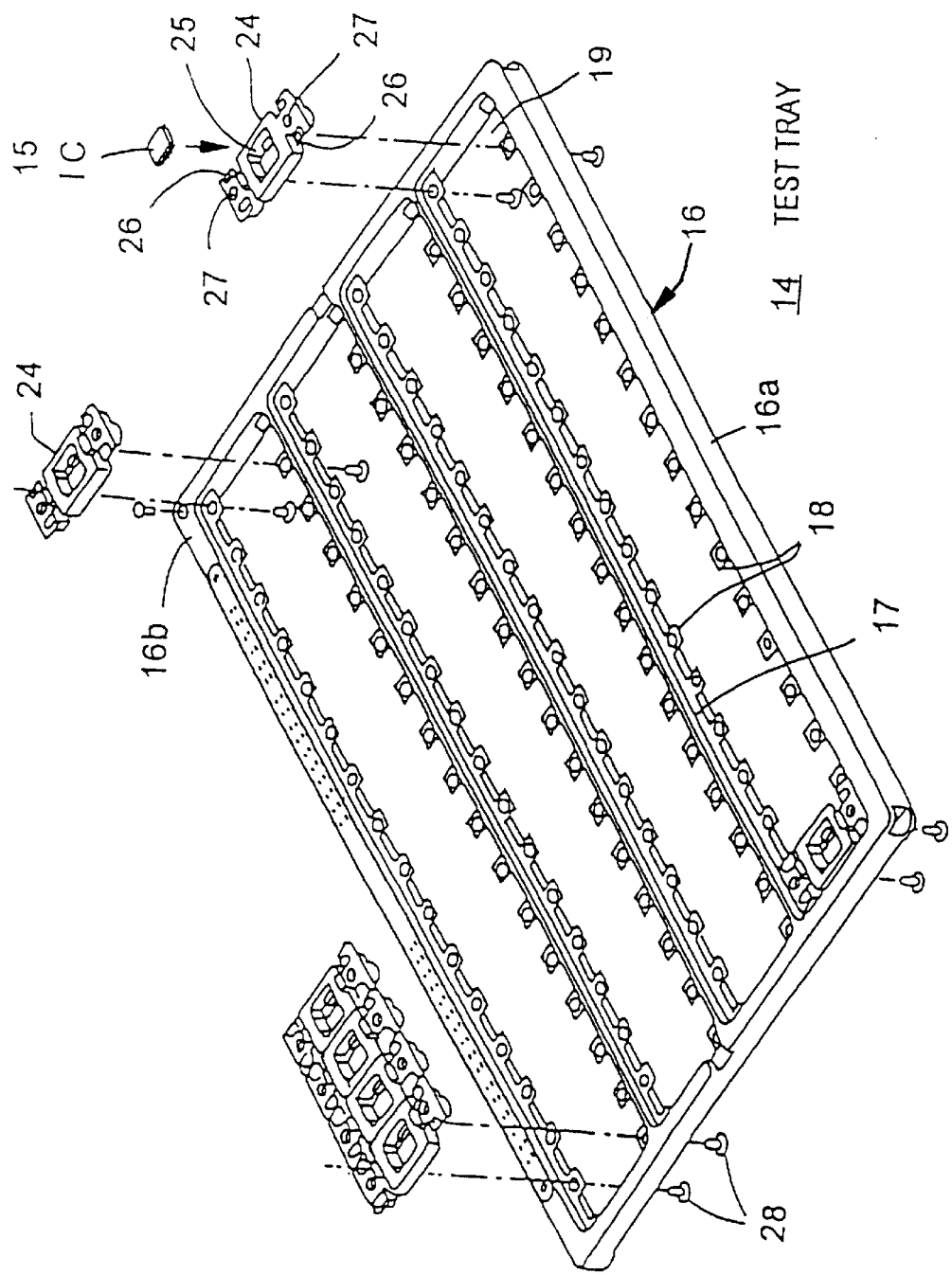
FIG. 2 is a perspective view showing the construction of a test tray used in the arrangement of FIG. 1.
Figure 3:
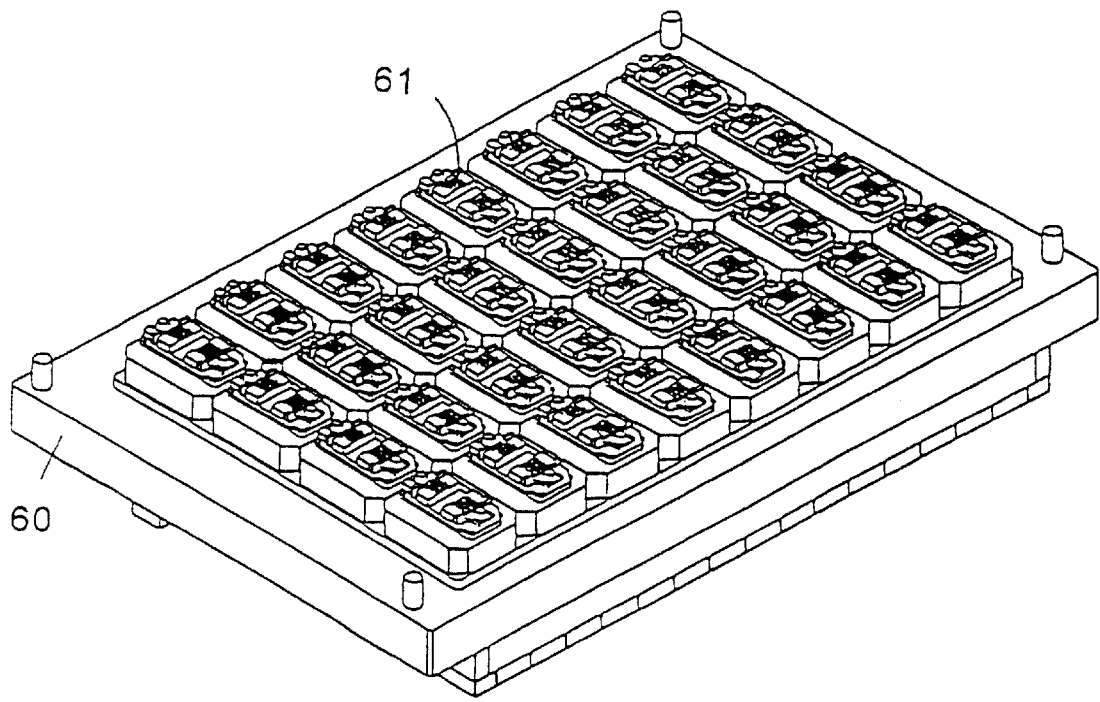
FIG. 3 is a perspective view showing the construction of a socket attachment having an array of sockets.
Figure 4:
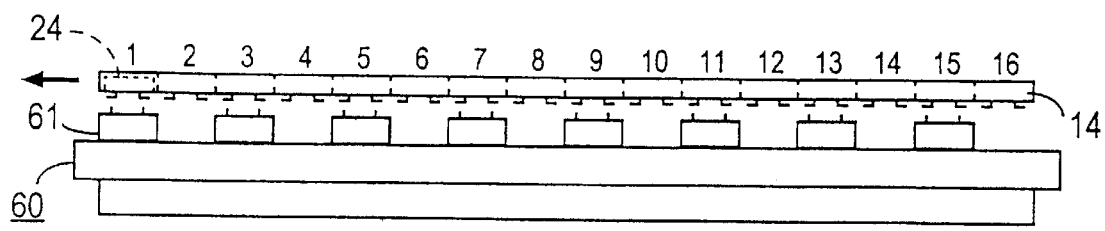
FIG. 4 is a side elevation illustrating a relationship between a test tray and a socket attachment used in a conventional testing method.
Figure 5:
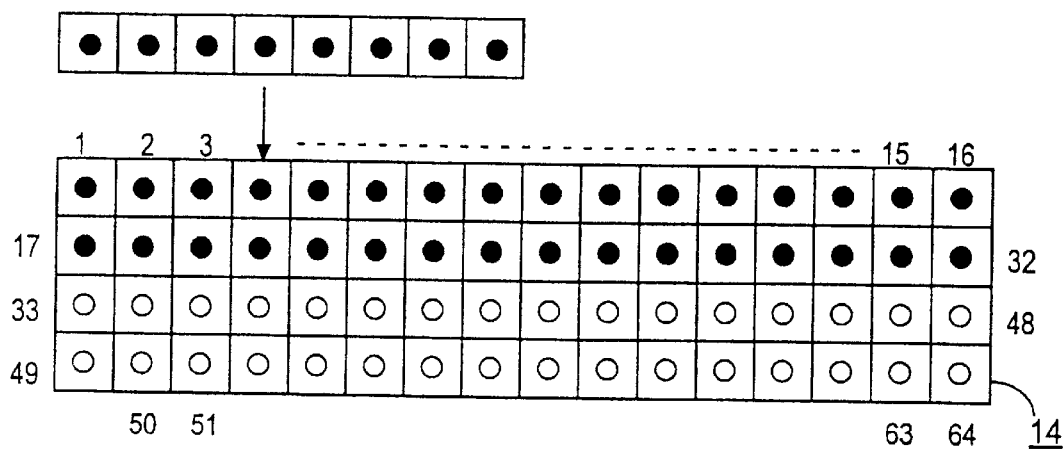
FIG. 5 is an illustration of a loading of IC's onto a test tray according to a conventional testing method.

In the present embodiment, denoting a total number of IC's to be tested in one lot by N, the number of IC carriers on a test tray by M, and a number of IC's which are subject to a simultaneous measurement through a socket attachment by K=mk, if a number of IC's are loaded on a test tray which is equal to the number M of IC carriers or if all of the IC carriers are loaded with IC's, eight IC's at one time are sequentially loaded into the front and the second half of each row as shown in FIG. 5, in the similar manner as in the prior art. The IC's, which are equal to mn in number, which are loaded on the test tray are connected to the IC sockets disposed in an array on a socket attachment which is mounted on the test head in the test section and IC's in k columns are simultaneously tested. Such test is repeated while translating the test tray by one pitch as indicated in the table below.

| order of test measurement | Nos. of columns subject to simultaneous |
|---|---|
| 1st | 1, a + 1, 2a + 1, . . . , a(k − 1) + 1 |
| 2nd | 2, a + 2, 2a + 2, . . . , a(k − 1) + 2 |
| . | |
| . | |
| . | |
| a-th | a, a + a, 2a + a, . . . , a(k − 1) + a |

In this manner, by repeating the test a times, the test of all the IC's on the test tray which are equal to M=mn is completed. It will be noted that the order of test when an attachment having an m×k=4×8 array of IC sockets is used and the order of test when a socket attachment having an m×k=4×4 array of IC sockets is used for an m×n=4×16 array of IC carriers on a test tray are indicated below each column of the IC carrier array shown in FIG. 6A. It will be seen that IC's in the columns having the same sequential number are subject to a simultaneous measurement. Accordingly, the test of all of sixty-four IC's on the test tray are completed in two tests for a 4×8 array of sockets and in four tests for a 4×4 array of sockets.

When a number of IC's to be tested, R, which are left in the loader is less than the number of IC carriers on the test tray, m×n, or if the inequality 0<R≦mk is satisfied, for example, the test of a number of IC's which are equal in number to R will be completed in one test when these IC's are disposed in k columns indicated by column number 1, a+1, 2a+1, . . . , a(k−1)+1 which are tested during the first test run indicated in the above table. If the number, R, of the IC's to be tested which are left in the loader satisfies the inequality mk<R≦2mk, a testing of all of R IC's can be completed in two tests when the IC's to be tested are loaded in the columns which are subject to the first and the second test run. More generally, when the number R of the IC's to be tested which remain becomes less than the number mn of IC carriers on the test tray, the IC's to be tested may be loaded in respective columns which are subject to a simultaneous measurement indicated in the above table. The number of tests, X, required for the test tray having a number of IC's to be tested loaded thereon which are less in number than mn can be represented as

X=[R/K]

where the total number K of IC carriers is represented as K=mk and [R/K] represents a minimum integer which is equal to or greater than a real number R/K.

Figure 7:
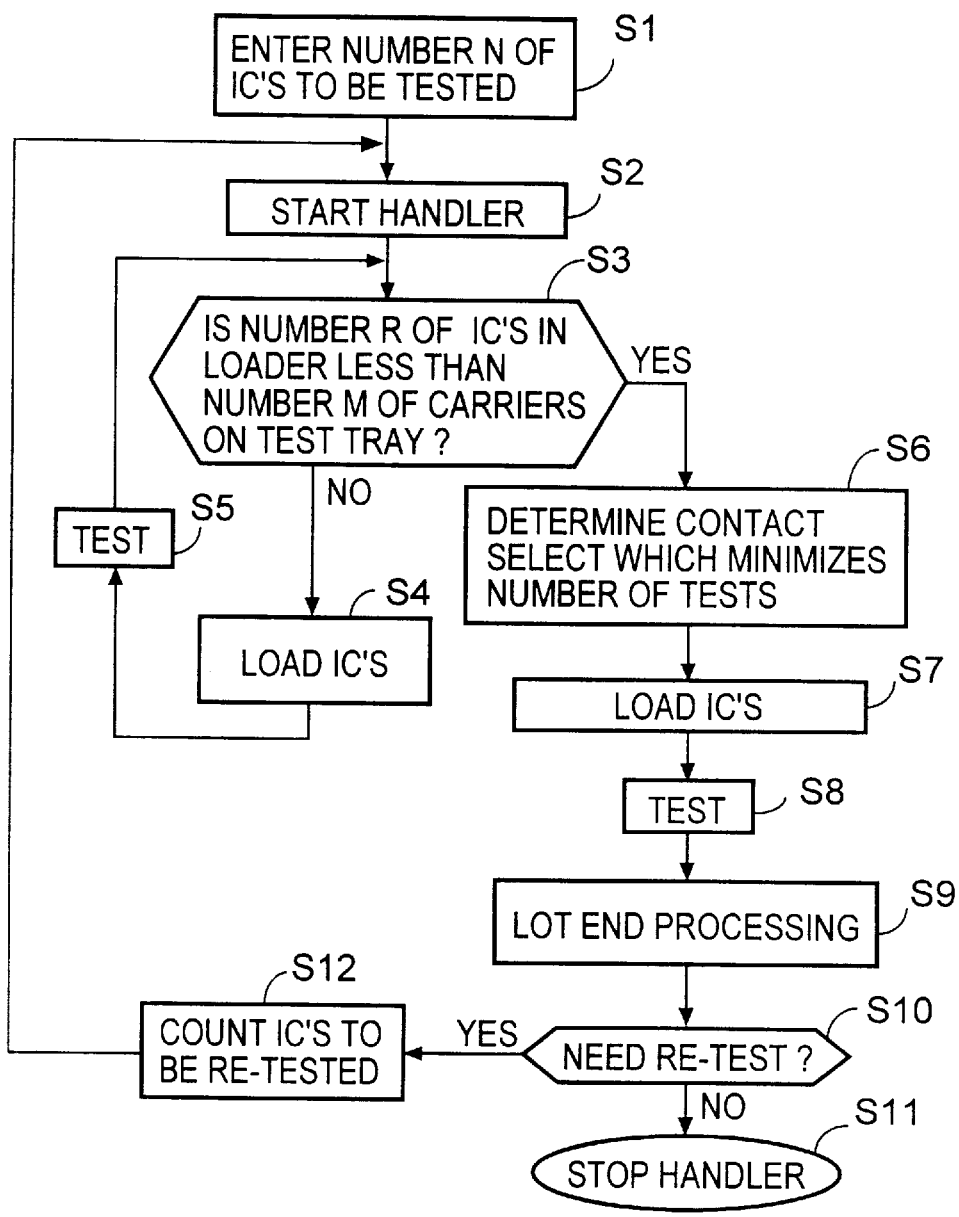
FIG. 7 is a flow chart of a testing procedure according to one embodiment of the invention.

An IC testing procedure will now be described with reference to FIG. 7. Before initiating a first test run, a number, N, of IC's in one lot to be tested is entered from an entry unit at step S1. In the given example, 608 is entered as representing the number N of IC's. At step S2, the handler is started, and at step S3, a number, R, of IC's which are present in the loader (it is to be noted that an initial value of R is equal to N) is compared against a number, M, of IC carriers on a test tray to determine if the number R of IC's to be tested which remain in the loader is less than the number M of IC carriers on the test tray when the test tray is conveyed to the loader. If NO, a loading of eight IC's at one time, for example, onto the IC carriers is executed until the number of IC's reaches sixty-four. The test tray having sixty-four IC's loaded thereon is conveyed into the test section for measurement at step S5. On the basis of a result of such measurement, individual IC is categorized, for example, as good, faulty or need re-test.

Since the initial number of IC's to be tested is equal to 608, a loading of IC's onto an empty test tray and a test/measurement of the loaded test tray is repeated a total of nine times at steps S3, S4, S5. This leaves thirty-two IC's to be tested in the loader. The number of the remaining IC's is less than the number N of IC carriers on the test tray which is equal to sixty-four, and hence the operation transfers to step S6 where a contact select is performed which minimizes the number of tests required for the test tray having thirty-two IC's to be tested loaded thereon according to algorithm mentioned above. The contact select refers to a choice of particular ones of the sixty-four IC carriers on the test tray, which are to be loaded with IC's or which are not to be loaded with IC's. Each IC carrier is numbered, and this number as well as the number of a particular IC to be tested which is loaded on the IC carrier of a particular number of a particular test tray number are stored in a storage in a corresponding manner.

A result of the contact select is indicated by black circles in FIG. 6A. IC's are loaded on the IC carriers in accordance with the result of the contact select. A condition established by the contact select is reset when conducting a test for the next test tray. When a loading by the loader is completed, an IC test takes place at step S8, and on the basis of result of such test, IC's are categorized, thus completing the test for all IC's. Subsequently, at step S9, all of the IC's are subject to a sorting operation. At step S10, it is examined whether there is any IC which needs a re-test on the basis of a result of the sorting operation. If there is none, the handler is stopped at step S11.

If it is found at step S10 that there is an IC or IC's which need a re-test, the number of such IC's is counted at a step S12, and the count N' is stored in a memory. The operation then returns to step S2, again driving the handler and initiating a re-test for N' IC's. Subsequently, a similar operation is repeated, and when it is found at step S10 that there is no IC which needs a re-test, the handler is stopped at S11, terminating the test.

EFFECTS OF THE INVENTION

As described, in accordance with the invention, when the number of IC's to be tested which are to be loaded on a test tray becomes less than the number of IC carriers on the test tray, the IC's are disposed at respective positions in the sequence of columns which are subject to a simultaneous measurement in the test section, thus enabling the number of test required to be minimized.

What is claimed is:

1. An IC testing method in which loader loads IC's to be tested on IC carriers disposed in an m-row, n-column array on a test tray and in which a test section connects IC's to be tested with sockets disposed in an m-row, k-column array on a socket attachment, the column on the socket attachment corresponding to every a-th column of IC carriers, where both m and k are integers equal to or greater than two, n=ak where a is an integer equal to or greater than two, comprising the steps of:

(a) determining whether or not the number of IC's to be tested in the loader is equal to or greater than the number of IC carriers;

(b) if the number of IC's to be tested is equal to or greater than the number of IC carriers, causing the loader to load IC's to be tested on all of the IC carriers in the test tray, causing the test section to connect the IC's to be tested in the k columns which correspond to every a-th column of the IC carriers with the corresponding sockets to perform a test of simultaneously measurement, and repeating the test a times while translating the test tray by an IC carrier array pitch, thus completing a test for all the IC's to be tested on the test tray; and (c) if it is determined at step (a) that the number of IC's to be tested is less than the number of IC carriers, disposing the IC's to be tested at respective positions in a sequence of columns which are subject to a simultaneous measurement in the test section, causing the test section to connect the IC's to be tested which are located in a manner corresponding to every a-th column of IC carriers with the corresponding sockets to perform a test of simultaneous measurement, and repeating the test while translating the test tray by an IC a carrier array pitch, thus completing a test for all the IC's to be tested on the test tray.

2. An IC testing method according to claim 1 in which the step (c) comprises the steps of loading the IC's to be tested on IC carriers in every a-th column among columns 1 to X of IC carriers on the test tray in the loader, and connecting the IC's to be tested in every a-th column of IC carriers with the corresponding sockets to perform a test of simultaneous measurement in the test section, and repeating such test X times while translating the test tray by an IC carrier array pitch to complete a testing of all the IC's to be tested in the test tray wherein X=[R/K], R represents the number of IC's to be tested which remain in the loader, K=mk and [R/K] represents a minimum integer equal to or greater than.

3. An IC testing method according to claim 2 in which denoting an initial total number of the IC's to be tested by N, a quotient of N divided by K by Q and a remainder by q, the step (b) is repeated Q times, and if q is equal to or greater than 1, the step (c) is executed once, and if q=0, the step (c) is not executed.

4. An IC testing method according to one of claim 1, further comprising a lot end processing step of categorizing all of IC's to be tested in accordance with a result of measurement upon completion of the test conducted with respective test tray at the steps (b) and (c).

5. An IC testing method according to claim 4, further comprising the steps of counting the number of IC's which are categorized as needing a re-test by the lot end processing step, and again executing the steps (a), (b) and (c) using the count of IC's as a new initial value.

6. An IC testing method according to one of claim 1, in which the value of k is previously selected in accordance with the variety of the socket attachment.

* * * * *

UNITED STATES PATENT AND TRADEMARK OFFICE
CERTIFICATE OF CORRECTION

PATENT NO.: 6,163,146
DATED : December 19, 2000
INVENTOR(S): Suzuki et al.

It is certified that errors appear in the above-identified patent and that said Letters Patent is hereby corrected as shown below:

Column 6,
    in the TABLE, line 7, delete "measurement", and on the same line, after "simultaneous" insert --measurement--.*

Column 8,
    line 10, change "simultaneously" to --simultaneous--;*
    line 46, delete "one of"; and
    line 56, delete "one of".

Signed and Sealed this

Twenty-ninth Day of May, 2001

NICHOLAS P. GODICI

*Attest:*

*Attesting Officer*       *Acting Director of the United States Patent and Trademark Office*